United States Patent
Koike

(10) Patent No.: US 8,874,869 B2
(45) Date of Patent: Oct. 28, 2014

(54) SEMICONDUCTOR MEMORY DEVICE

(75) Inventor: Tsuyoshi Koike, Shiga (JP)

(73) Assignee: Panasonic Corporation, Osaka (JP)

( * ) Notice: Subject to any disclaimer, the term of this patent is extended or adjusted under 35 U.S.C. 154(b) by 156 days.

(21) Appl. No.: 13/363,585

(22) Filed: Feb. 1, 2012

(65) Prior Publication Data

US 2012/0137083 A1 May 31, 2012

Related U.S. Application Data

(63) Continuation of application No. PCT/JP2010/004548, filed on Jul. 13, 2010.

(30) Foreign Application Priority Data

Aug. 7, 2009 (JP) ................................. 2009-184242

(51) Int. Cl.
*G06F 12/10* (2006.01)
*G11C 15/04* (2006.01)

(52) U.S. Cl.
CPC ............ *G11C 15/04* (2013.01); *G06F 12/1027* (2013.01); *G06F 2212/652* (2013.01)
USPC .......................................... 711/165; 711/207

(58) Field of Classification Search
CPC ... G06F 12/0246; G06F 3/0605; G06F 3/067; G06F 12/10; G06F 12/027; G06F 2212/65; G11C 16/102; H05K 999/99
USPC ............................ 711/165, 203, 205, 206, 207
See application file for complete search history.

(56) References Cited

U.S. PATENT DOCUMENTS

| | | | |
|---|---|---|---|
| 5,327,372 A | 7/1994 | Oka et al. | |
| 5,530,824 A | 6/1996 | Peng et al. | |
| 5,712,998 A * | 1/1998 | Rosen ........................... | 711/205 |
| 5,717,885 A | 2/1998 | Kumar et al. | |
| 5,796,978 A | 8/1998 | Yoshioka et al. | |
| 6,446,187 B1 * | 9/2002 | Riedlinger et al. ........... | 711/206 |
| 2002/0133685 A1 | 9/2002 | Kalyanasundharam | |

FOREIGN PATENT DOCUMENTS

| | | | | |
|---|---|---|---|---|
| JP | 7-295889 | 11/1995 | | |
| JP | 8-7580 | 1/1996 | | |
| JP | 8-101797 | 4/1996 | | |
| JP | 8-115261 | 5/1996 | | |
| JP | 08115261 A * | 5/1996 | ............. | G06F 12/10 |
| JP | 8-329687 | 12/1996 | | |
| JP | 2777034 | 5/1998 | | |
| JP | 2002-288038 | 10/2002 | | |

OTHER PUBLICATIONS

International Search Report of PCT Application No. PCT/JP2010/004548 dated on Oct. 19, 2010.

* cited by examiner

*Primary Examiner* — Charles Rones
*Assistant Examiner* — Andrew Russell
(74) *Attorney, Agent, or Firm* — McDermott Will & Emery LLP

(57) ABSTRACT

In a semiconductor memory device, an update data control circuit is provided, which selectively couples a physical address input data line or an effective address input data line to a common input data line coupled to a physical address cell that stores a physical address page number. A control terminal of an update circuit of the physical address cell is coupled to a page size cell that stores page size information via an update control circuit, to control a write port of the physical address cell with the page size cell.

10 Claims, 7 Drawing Sheets

SEMICONDUCTOR MEMORY DEVICE

CROSS-REFERENCE TO RELATED APPLICATIONS

This is a continuation of PCT International Application PCT/JP2010/004548 filed on Jul. 13, 2010, which claims priority to Japanese Patent Application No. 2009-184242 filed on Aug. 7, 2009. The disclosures of these applications including the specifications, the drawings, and the claims are hereby incorporated by reference in their entirety.

BACKGROUND

The present disclosure relates to a semiconductor memory device, and more particularly to a semiconductor memory device having an address translation function.

Most of memory management tools in recent computers adopt a virtual memory system, and a paging scheme is known as a method of associating virtual addresses with physical addresses in the virtual memory system. In the paging scheme, each of virtual address space and physical address space is divided into continuous space units having a given size called pages, and virtual page numbers (hereinafter abbreviated as VPNs) and physical page numbers (hereinafter abbreviated as PPNs) are respectively assigned to such virtual and physical pages, to determine correspondence between such addresses.

An effective address handled in the virtual memory system is represented by the page number and the offset in the page. A system where the page size is adjustable for effective use of the memory space is generally known, and in such a system, the range of bits of an effective address indicating the page number and the range of bits thereof indicating the offset in the page are adjustable. Bits that are subjected to address translation are higher-order bits indicating the page number: lower-order bits indicating the relative address are not subjected to translation.

The correspondence between VPNs and PPNs is managed by a mechanism using both hardware and software work, called a memory management unit (MMU). A correspondence table between VPNs and PPNs (page table) is basically stored in a low-speed memory device such as an auxiliary memory device.

In general, in operation of computers, VPN to PPN translation is frequently required, and thus holds the key to improving the processing performance of the system. In particular, in high-speed oriented computers, a high-speed functional memory called a translation lookaside buffer (TLB) is incorporated in the MMU, and a copy of part of the page table is stored, or cached, in the TLB for speedup of address translation.

The circuit of the TLB generally includes a VPN memory array and a PPN memory array. During address translation, the VPN memory array is searched with higher-order bits of an effective address. Once a match VPN is found, its corresponding PPN is read from the PPN memory array.

When a high hit rate is desired, a full associative scheme is adopted for the TLB. In the full associative TLB, all entries are targets of the search. As a circuit configuration for implementing this function at high speed, the VPN memory array uses, in each memory cell, a CAM cell having a bit comparison function and a comparator having a dynamic circuit that binds bit comparison results from the CAM cell. The dynamic node of the dynamic circuit is generally called a match line. If the match line is asserted in address translation, a word line for a memory of the corresponding entry in the PPN memory array is selected, to read a desired PPN from the PPN memory array.

In a page size-adjustable TLB, a page size memory for storing the page size is provided for each entry of the address translation pair to allow adjustment of the translation range. In address translation, first, address comparison is performed, excluding some bit or bits from the target of comparison based on information stored in the page size memory for the entry in the VPN memory array. Then, the PPN of an entry of which the match line has been asserted is read from the PPN memory array. At this time, it is necessary to output the input effective address as it is for a bit or bits falling outside the translation range based on the data stored in the page size memory.

As a configuration of the PPN memory array achieving the above, a technique is known in which information is read from the page size memory for an entry of which the match line has been asserted and from the corresponding PPN memory cell simultaneously, and a selection circuit is provided on the periphery of the memory array to select either the effective address or the data stored in the PPN memory cell for a bit for which such selection is required (see Japanese Patent Publication No. H08-329687 (Patent Document 1)).

Also known is a technique in which a selection circuit for selecting either the effective address or the information stored in the PPN memory cell is provided inside the memory cell, to perform the selection before activation of the word line (see Japanese Patent Publication No. 2002-288038 (Patent Document 2)).

SUMMARY

The circuit disclosed in Patent Document 2 has the following problem.

First, since as many as 14 transistors are necessary in each memory cell, it is difficult to reduce the area. Also, in relation to this, since the lengths of word lines and readout data lines are long, speedup is difficult.

Moreover, since a signal line for the effective address is necessary in the memory cell array, the degree of congestion of interconnects in a memory cell increases. As a result, speed deterioration may occur due to increase in the coupling capacitance of readout data lines, and space may become too tight to allow placement of signal interconnects.

In addition, for entries of the PPN memory cells (physical address cells), while some memory cells have a multiplexer for selecting readout data based on the page size, others have no multiplexer because the page size is not adjusted. Therefore, the regularity of the layout of the memory array is impaired, and this may significantly affect the yield in microfabrication processes, in particular.

It is an objective of the present disclosure to implement a high-yield, small-area, and high-speed semiconductor memory device having an address translation function.

Summary of representative examples of the present disclosure will be described briefly as follows.

The first semiconductor memory device of the present disclosure includes: a first memory circuit; a second memory circuit; a readout circuit configured to read out data stored in the first memory circuit to a first output data line based on the data in the first memory circuit and a first control signal; an update circuit configured to update the data in the first memory circuit to data on a first input data line based on data stored in the second memory circuit; and an update data control circuit having a function of selectively outputting first update data or second update data to the first input data line.

The second semiconductor memory device of the present disclosure includes: a first memory circuit; a second memory circuit; a readout circuit configured to read out data stored in the first memory circuit to a first output data line based on the data in the first memory circuit and a first control signal; a first update circuit configured to update the data in the first memory circuit to first update data based on a second control signal; and a second update circuit configured to update the data in the first memory circuit to second update data based on data stored in the second memory circuit.

According to the present disclosure, a high-yield, small-area, and high-speed semiconductor memory device having an address translation function can be implemented.

DETAILED DESCRIPTION

Embodiments of the present disclosure will be described hereinafter in detail with reference to the accompanying drawings presented, not for restricting, but for illustrating the present disclosure. It should be noted that, although the present disclosure is described using an address translation device as an example, it is also applicable to devices in other fields.

First Embodiment

Figure 1:
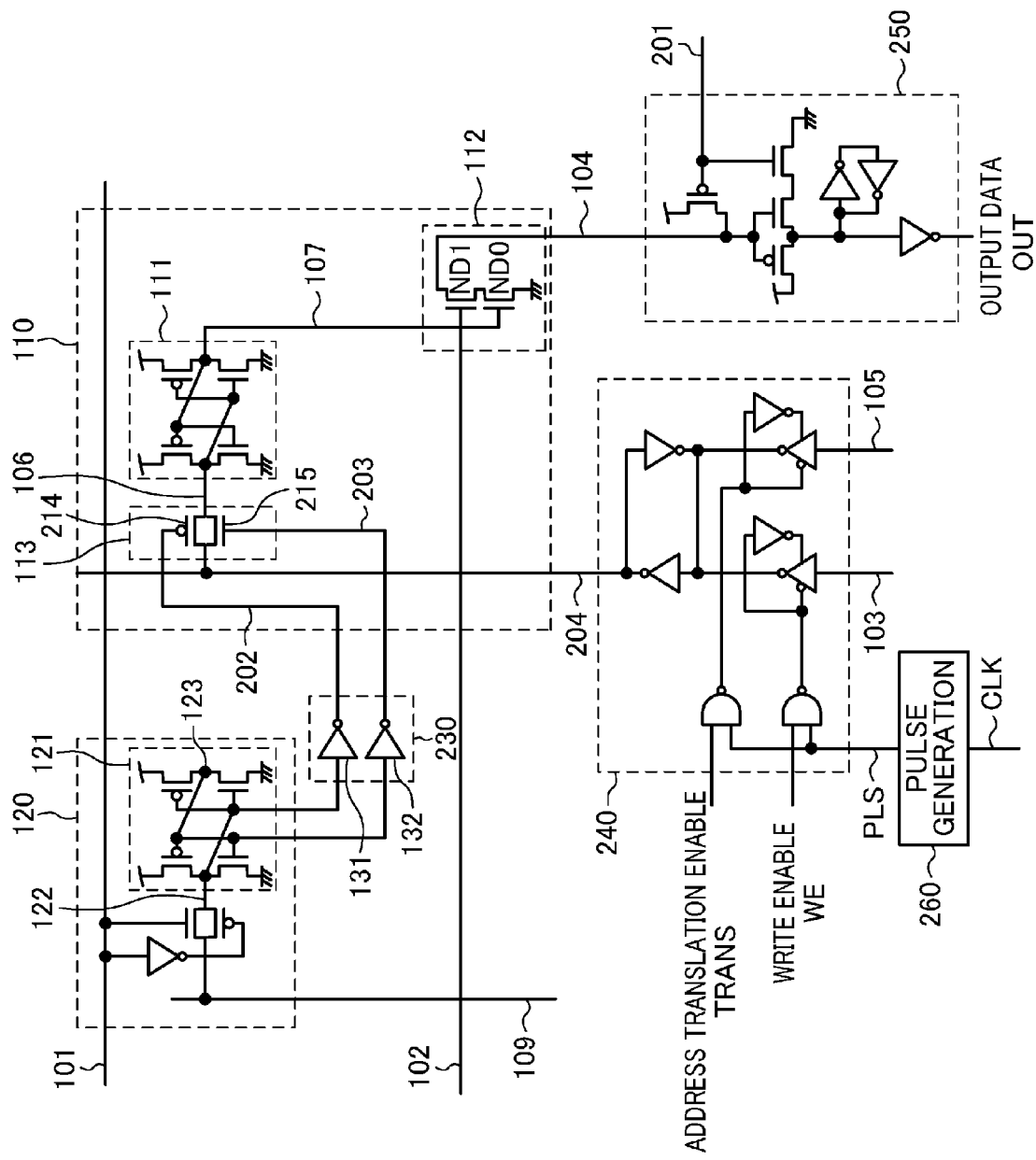
FIG. 1 is a circuit diagram of a semiconductor memory device of the first embodiment of the present disclosure.

FIG. 1 shows a circuit diagram of a semiconductor memory device of the first embodiment of the present disclosure. In the schematic configuration shown in FIG. 1, an update data control circuit 240 selectively couples a physical address input data line 103 or an effective address input data line 105 to a common input data line 204 that is coupled to a physical address cell (PPN memory cell) 110, and control terminals of an update circuit 113 of the physical address cell 110 are coupled to a page size cell 120 via an update control circuit 230.

With the configuration of FIG. 1, during address translation readout, one bit of an effective address is placed on the effective address input data line 105. At this time, if a first memory node 122 of a memory circuit 121 of the page size cell 120 that stores one bit of page size information is high, a memory circuit 111 of the physical address cell 110 is rewritten with the effective address placed on the effective address input data line 105. With activation of a readout word line 102, the effective address is output to an address output data line 104. Conversely, if the first memory node 122 of the memory circuit 121 of the page size cell 120 is low, the update circuit 113 is off, and thus the memory circuit 111 of the physical address cell 110 keeps holding its stored information (one bit of PPN). With activation of the readout word line 102, the PPN is output to the address output data line 104.

More specifically, the physical address cell 110 includes: the memory circuit 111; a readout circuit 112 that reads out data in the memory circuit 111 to the address output data line 104 based on the state of the readout word line 102; and the update circuit 113 that updates data in the memory circuit 111 with data on the physical address input data line 103 or the effective address input data line 105, based on the data in the memory circuit 121 of the page size cell 120. The update circuit 113 is coupled to a first memory node 106 of the memory circuit 111, and the readout circuit 112 is coupled to a second memory node 107 of the memory circuit 111.

The configuration of FIG. 1 includes, in addition to the physical address cell 110 described above: the page size cell 120 having the memory circuit 121 that stores selection information on readout data from the memory circuit 111; the update control circuit 230 that controls the update circuit 113 of the physical address cell 110 based on the state of the memory circuit 121; the update data control circuit 240 having the function of selectively outputting data on the physical address input data line 103 or data on the effective address input data line 105 to a write port of the physical address cell 110; an output buffer 250 that couples the address output data line 104 to output data OUT; and a pulse generation circuit 260 that generates a pulse signal PLS from a clock signal CLK. TRANS denotes an address translation enable signal, and WE denotes a write enable signal.

The update circuit 113 of the physical address cell 110 includes: a PMOS transistor 214 having a source coupled to data on either the physical address input data line 103 or the effective address input data line 105, a drain coupled to the memory circuit 111, and a gate coupled to a first update control signal 202 output from the update control circuit 230; and an NMOS transistor 215 having a source coupled to data on either the physical address input data line 103 or the effective address input data line 105, a drain coupled to the memory circuit 111, and a gate coupled to a second update control signal 203 output from the update control circuit 230. The update control circuit 230 has a first inverter 131 and a second inverter 132. The first update control signal 202 is coupled to the first memory node 122 of the memory circuit 121 of the page size cell 120 via the first inverter 131, and the second update control signal 203 is coupled to a second memory node 123 of the memory circuit 121 of the page size cell 120 via the second inverter 132.

Note that the first update control signal 202 may be coupled to the first memory node 122 of the memory circuit 121 of the page size cell 120 via a plurality of inverters, and the second update control signal 203 may be coupled to the second memory node 123 of the memory circuit 121 of the page size cell 120 via a plurality of inverters. Alternatively, the update control circuit 230 may be omitted, and the first memory node 122 of the memory circuit 121 may be directly coupled to the gate of the PMOS transistor 214 of the update circuit 113, and the second memory node 123 of the memory circuit 121 may be directly coupled to the gate of the NMOS transistor 215 of the update circuit 113. In this case, while equal functions are obtained, the number of elements of the update control circuit 230 can be reduced.

The operation of the circuit of FIG. 1 will be described with reference to the timing chart of FIG. 2. In the circuit of FIG. 1, the write operation must be performed in three steps. That is, write into the page size cell 120 is first performed, and then write into the physical address cell 110 is performed. The reason for this is as follows. The write port of the physical address cell 110 is controlled with data stored in the page size cell 120. Therefore, when write into the physical address cell 110 is intended, it is necessary to write data into the page size cell 120 so that the first memory node 122 of the memory circuit 121 of the page size cell 120 becomes high, which is performed by changing a write word line 101 from low to high while keeping a page size input data line 109 high. By placing data on the physical address input data line 103 in this state, data is written into the memory circuit 111 of the physical address cell 110. Thereafter, while the state of the physical address input data line 103 is kept unchanged, page size data to be written is placed on the page size input data line 109, whereby the data is written into the memory circuit 121 of the page size cell 120. The data written into the memory circuit 121 is readout data selection information used to determine which data, the physical address data or the effective address data, should be read out. Finally, the write word line 101 is changed from high to low, to terminate the write operation. During this write operation, a readout data line precharge signal 201 is kept low.

Next, address translation operation will be described. In the address translation operation, the readout word line 102 is activated in response to assertion of a match line (not shown) as a result of comparison in a tag array (not shown). Prior to this activation, an effective address has been placed on the effective address input data line 105. When the first memory node 122 of the memory circuit 121 of the page size cell 120 is high, which indicates that the write port of the physical address cell 110 as the control target is open, the memory circuit 111 of the physical address cell 110 is rewritten with the effective address. Contrarily, when the first memory node 122 of the memory circuit 121 of the page size cell 120 is low, which indicates that the write port of the physical address cell 110 is closed, the memory circuit 111 of the physical address cell 110 holds the stored physical address. The on/off of an NMOS transistor ND0 is determined depending on the state of the memory circuit 111 of the physical address cell 110. The readout word line 102 is activated after the setting of the above state, turning on an NMOS transistor ND1. At this time, the address output data line 104 maintains the potential previously precharged with VDD or is discharged, depending on the on/off state of the NMOS transistor ND0, whereby readout data is output to the address output data line 104. It must be ensured that precharging of the address output data line 104 has been turned off before activation of the readout word line 102. Note that if a match line is negated as a result of comparison in the tag array, the readout word line 102 is not activated, keeping the physical address cell 110 separated from the address output data line 104.

Figure 2:
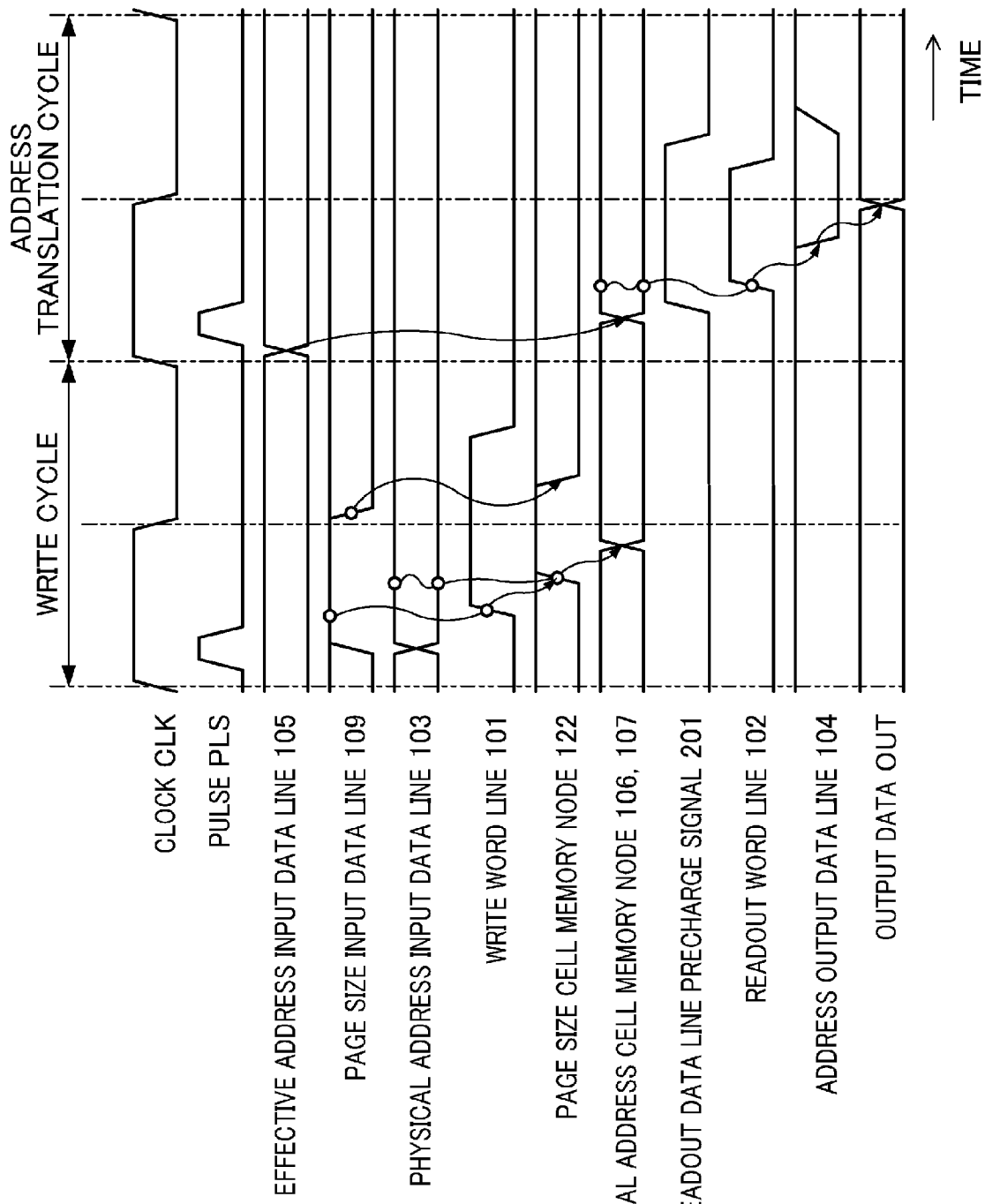
FIG. 2 is a timing chart showing the operation of the semiconductor memory device of FIG. 1.

The sequence in the timing chart of FIG. 2 includes three steps of writing reset data into the page size cell 120, writing data into the physical address cell 110, and writing data into the page size cell 120. Through these three steps, the write word line 101 must be kept high. Therefore, if the frequency of a clock signal CLK is high, it may be difficult to complete the write operation within one cycle. In such a case, it is helpful to perform the write operation over two cycles. That is, in the first write cycle, data with which the first memory node 122 of the memory circuit 121 of the page size cell 120 becomes high may be written, and also data may be written into the physical address cell 110. In the second write cycle, data may be written into the page size cell 120.

Alternatively, in order to speed up the reset operation of the page size cell 120, an NMOS transistor having a source grounded and a drain coupled to the second memory node 123, for example, may be provided, and a reset signal may be coupled to the gate of this NMOS transistor. Having this configuration, operation similar to that shown in FIG. 2 can be implemented. In this case, since the time required for reset of the page size cell 120 can be made shorter than in the case of the operation shown by the timing chart of FIG. 2, the write cycle can be shortened.

According to the configuration of FIG. 1 described above, the physical address cell 110 can be constituted by a reduced number of components while achieving higher-speed readout than conventionally done. That is, since the physical address cell 110 in FIG. 1 can be constituted by eight transistors, the area required can be reduced. Also, since the number of interconnects extending vertically to the readout word line 102 is small, the number of interconnect channels can be reduced. Moreover, since the size of the physical address cell 110 can be reduced, the lengths of interconnects in the directions of bit lines and word lines can be reduced, whereby further speedup can be expected. In addition, since the memory array of the physical address cells 110 can be made of one type of memory cells, the regularity of the layout is maintained, allowing achievement of high yield. Moreover, since the number of types of memory cells to be designed decreases, the number of fabrication steps can be reduced.

Although the update control circuit 230 is placed outside the page size cell 120 in the illustration of FIG. 1, it will equally function when it is placed inside.

Second Embodiment

Figure 3:
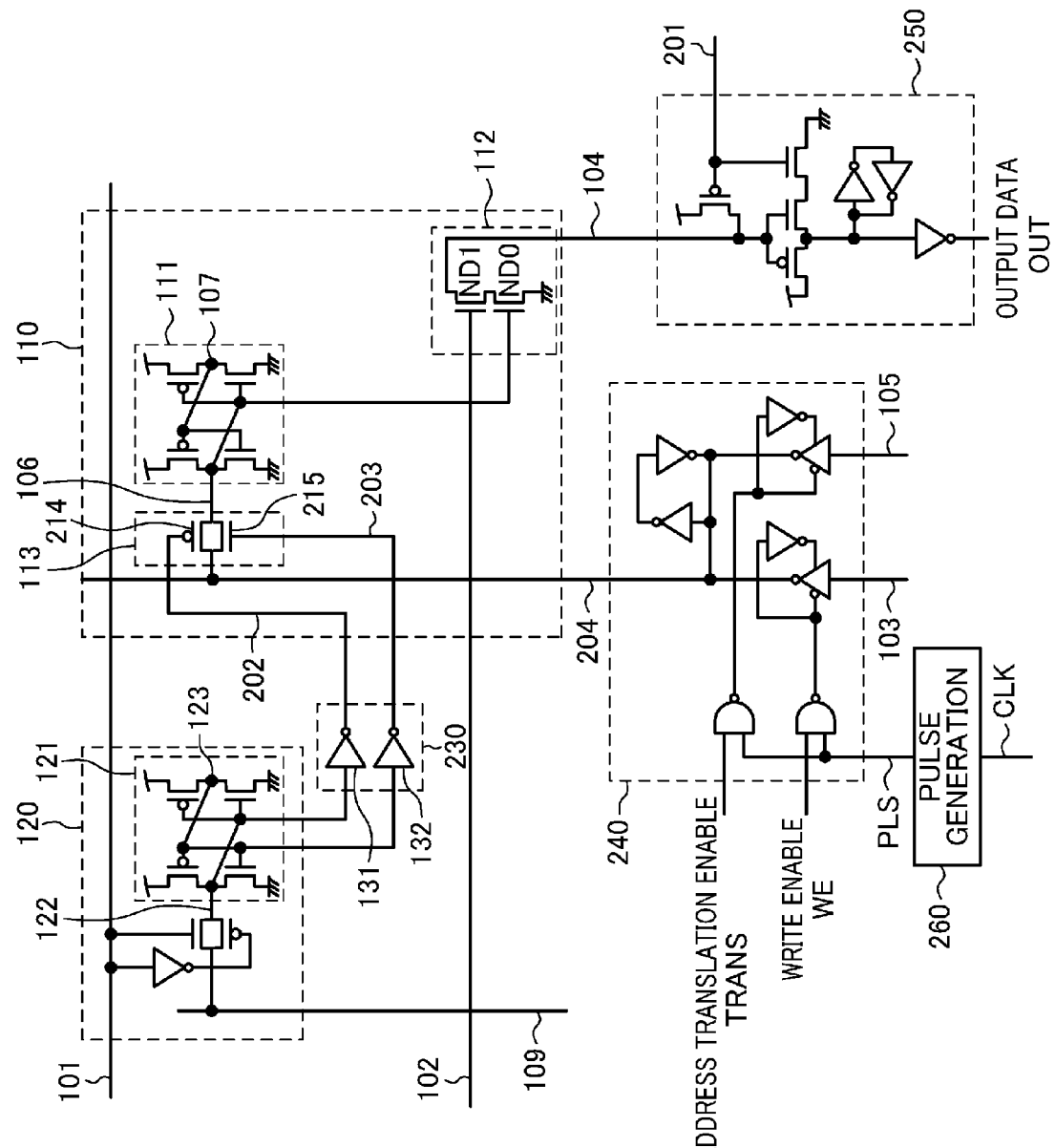
FIG. 3 is a circuit diagram of a semiconductor memory device of the second embodiment of the present disclosure.

FIG. 3 shows a circuit diagram of a semiconductor memory device of the second embodiment of the present disclosure. The semiconductor memory device of this embodiment is different from that of the first embodiment in that, in the physical address cell 110, the update circuit 113 and the readout circuit 112 are coupled to the same node 106 of the memory circuit 111.

A merit of the configuration of this embodiment is as follows. The number of stages of transistors required when an effective address is set in the memory circuit 111 prior to the transition of the readout word line 102 from low to high can be reduced by one stage of a load transistor or a drive transistor of the inverter of which the output is the second memory node 107 of the memory circuit 111, compared with the first embodiment. Thus, setup of the effective address can be eased.

Also, since the memory circuit 111 of the physical address cell 110 does not need to hold data when the first memory node 122 of the memory circuit 121 of the page size cell 120 is high, it will become easy to write an effective address into the node 106 via the update data control circuit 240 if the data retention capability of the memory circuit 111 is lowered. In addition, a wasteful standby current in the memory circuit 111 can be reduced.

Figure 4:
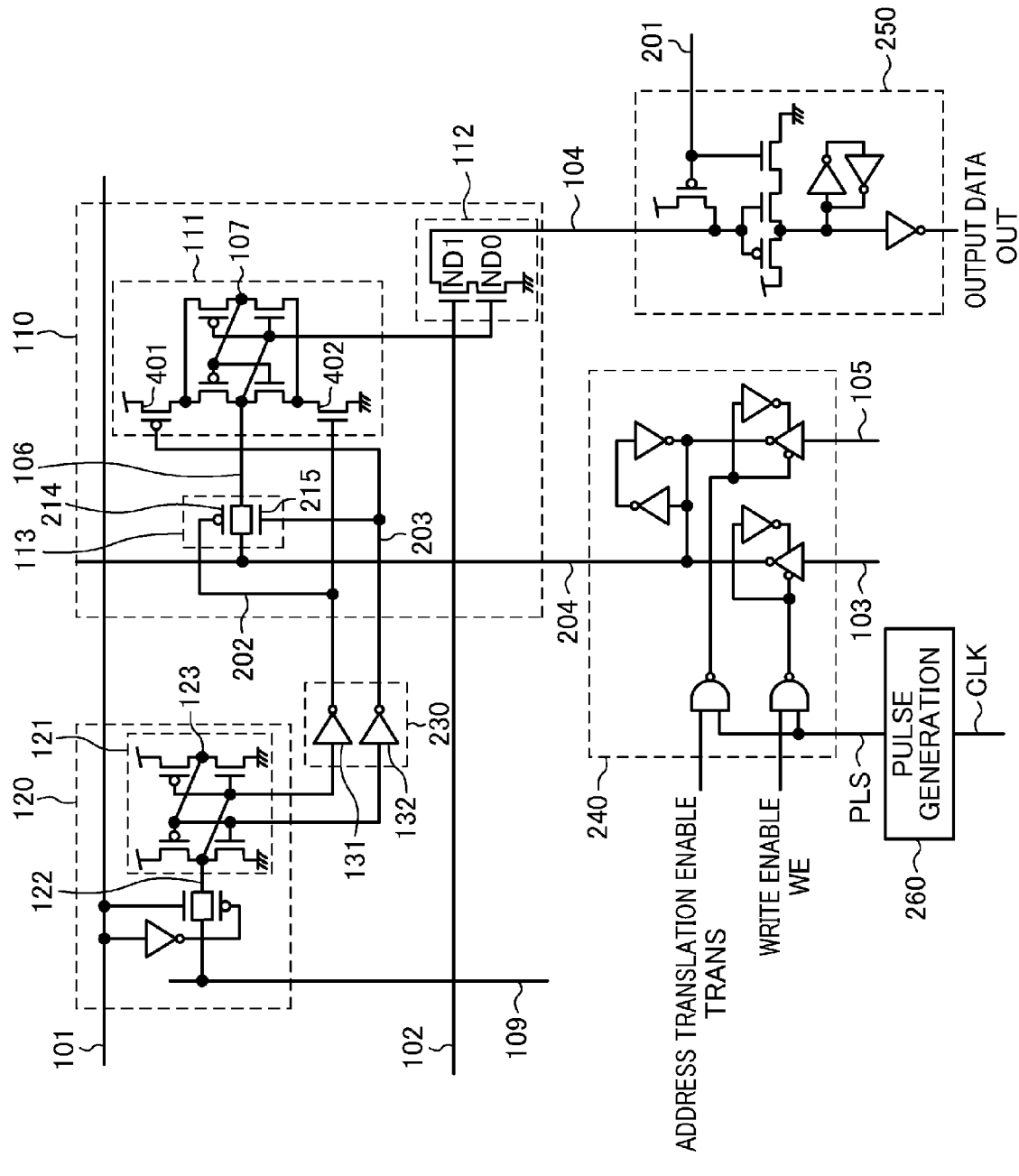
FIG. 4 is a circuit diagram of a variation of the semiconductor memory device of FIG. 3.

FIG. 4 shows a variation having the configuration described above. Referring to FIG. 4, a power-control PMOS transistor 401 is connected in series between the sources of the PMOS transistors of the memory circuit 111 of the physical address cell 110 and a higher power supply, and the gate of the power-control PMOS transistor 401 is coupled to the second update control signal 203 or the second memory node 123 of the memory circuit 121 of the page size cell 120. Similarly, a power-control NMOS transistor 402 is connected in series between the sources of the NMOS transistors of the memory circuit 111 of the physical address cell 110 and a lower power supply, and the gate of the power-control NMOS transistor 402 is coupled to the first update control signal 202 or the first memory node 122 of the memory circuit 121 of the page size cell 120. By turning off the power-control PMOS transistor 401 and the power-control NMOS transistor 402, the data retention capability of the memory circuit 111 can be cancelled.

In the illustrated example in FIG. 4, the data retention capability of the memory circuit 111 is lowered by shutting off or reducing the power to the PMOS or NMOS transistors of the memory circuit 111 using the power-control PMOS transistor 401 and the power-control NMOS transistor 402. If another configuration is adopted for the memory circuit 111, the data retention capability of the memory circuit 111 may be reduced by another means suitable for the adopted configuration.

Third Embodiment

Figure 5:
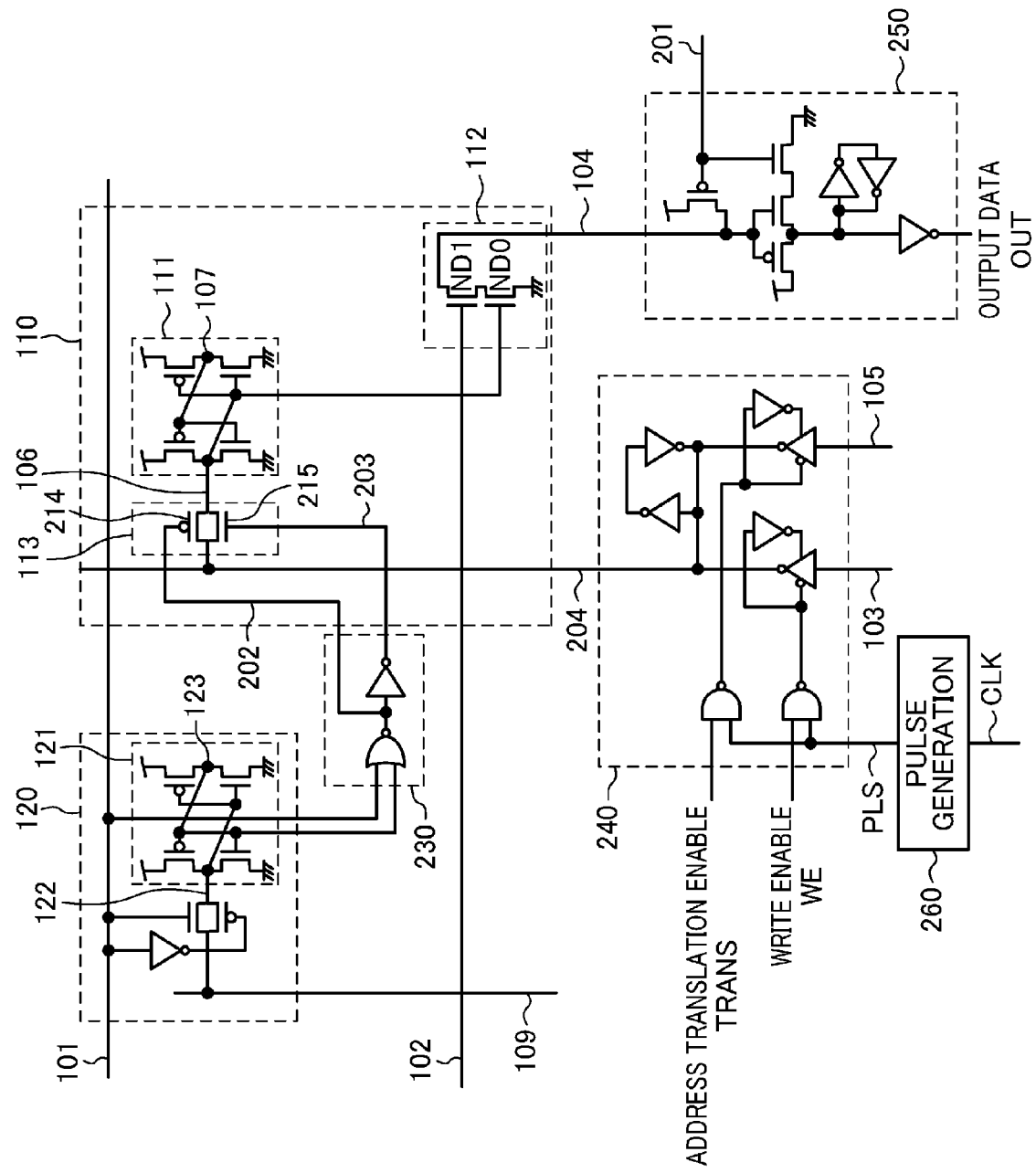
FIG. 5 is a circuit diagram of a semiconductor memory device of the third embodiment of the present disclosure.

FIG. 5 shows a circuit diagram of a semiconductor memory device of the third embodiment of the present disclosure. The semiconductor memory device of this embodiment is different from that of FIG. 3 in that the second memory node 123 of the memory circuit 121 of the page size cell 120 and the write word line 101 are coupled to the inputs of a NOR gate of the update control circuit 230, and the output of the NOR gate is coupled to the PMOS transistor 214 of the update circuit 113 while an inverted signal of the output of the NOR gate is coupled to the NMOS transistor 215 of the update circuit 113.

A merit of the configuration of this embodiment is that the write time can be shortened. That is, in the first and second embodiments, the page size cell 120 must be reset once to allow write of data into the physical address cell 110. In the configuration of FIG. 5, however, once the write word line 101 is changed from low to high, write of data into the physical address cell 110 is performed without waiting for reset of the page size cell 120. Thus, write into the page size cell 120 and write into the physical address cell 110 can be performed simultaneously, permitting shortening of the write time.

Fourth Embodiment

Figure 6:
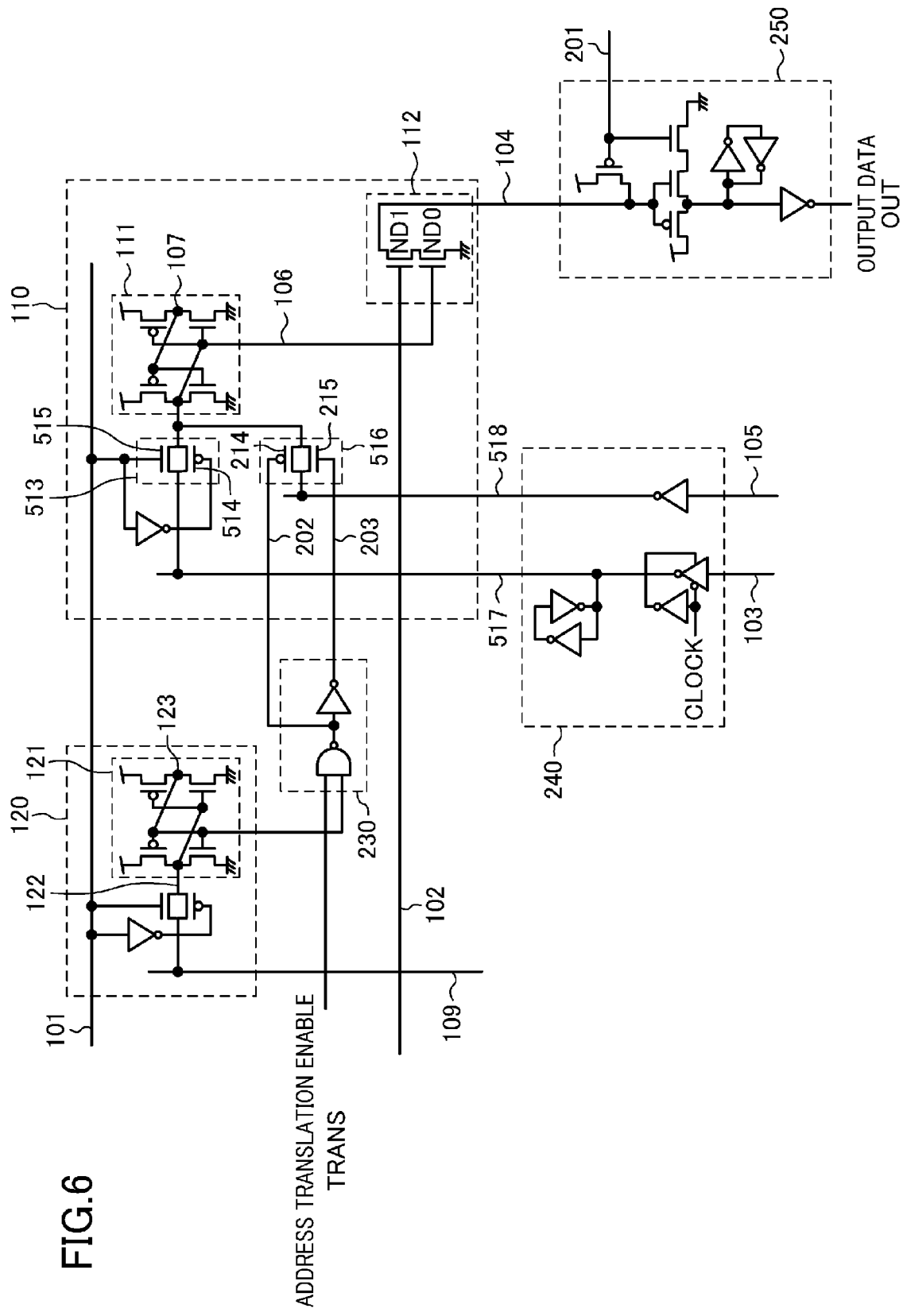
FIG. 6 is a circuit diagram of a semiconductor memory device of the fourth embodiment of the present disclosure.

FIG. 6 shows a circuit diagram of a semiconductor memory device of the fourth embodiment of the present disclosure. A feature of the semiconductor memory device of this embodiment is that the update circuit 113 of the memory circuit 111 of the physical address cell 110 in FIG. 1 is divided into a first update circuit 513 and a second update circuit 516, and while the on/off of the first update circuit 513 is controlled by the write word line 101, the on/off of the second update circuit 516 is controlled by the page size cell 120. To avoid simultaneous activation of the first and second update circuits 513 and 516, the control signal for the second update circuit 516 is generated by NAND between the second memory node 123 of the memory circuit 121 of the page size cell 120 and the address translation enable signal TRANS.

The first update circuit 513 includes a PMOS transistor 514 and an NMOS transistor 515, and is configured to couple a first input data line 517 based on the physical address input data line 103 to the first memory node 106 of the memory circuit 111. The second update circuit 516 includes the PMOS transistor 214 and the NMOS transistor 215, and is configured to couple a second input data line 518 based on the effective address input data line 105 to the first memory node 106 of the memory circuit 111.

A merit of the configuration of this embodiment is that the easiness of write into the physical address cell 110 improves. That is, in the configuration of the third embodiment (FIG. 5), in write of data into the physical address cell 110 for a given bit, the data may be written into a plurality of memory cells depending on the state of the page size cell 120 that controls the update circuit 113 of the physical address cell 110 for the same bit. Therefore, high drive capability is required for a driver that drives the physical address input data line 103. In the configuration of the fourth embodiment (FIG. 6), however, only the first update circuit 513 of the physical address cell 110 coupled to the write word line 101 as the write target is on, among others in the same bit, at the time of write. Therefore, the easiness of write improves.

Fifth Embodiment

Figure 7:
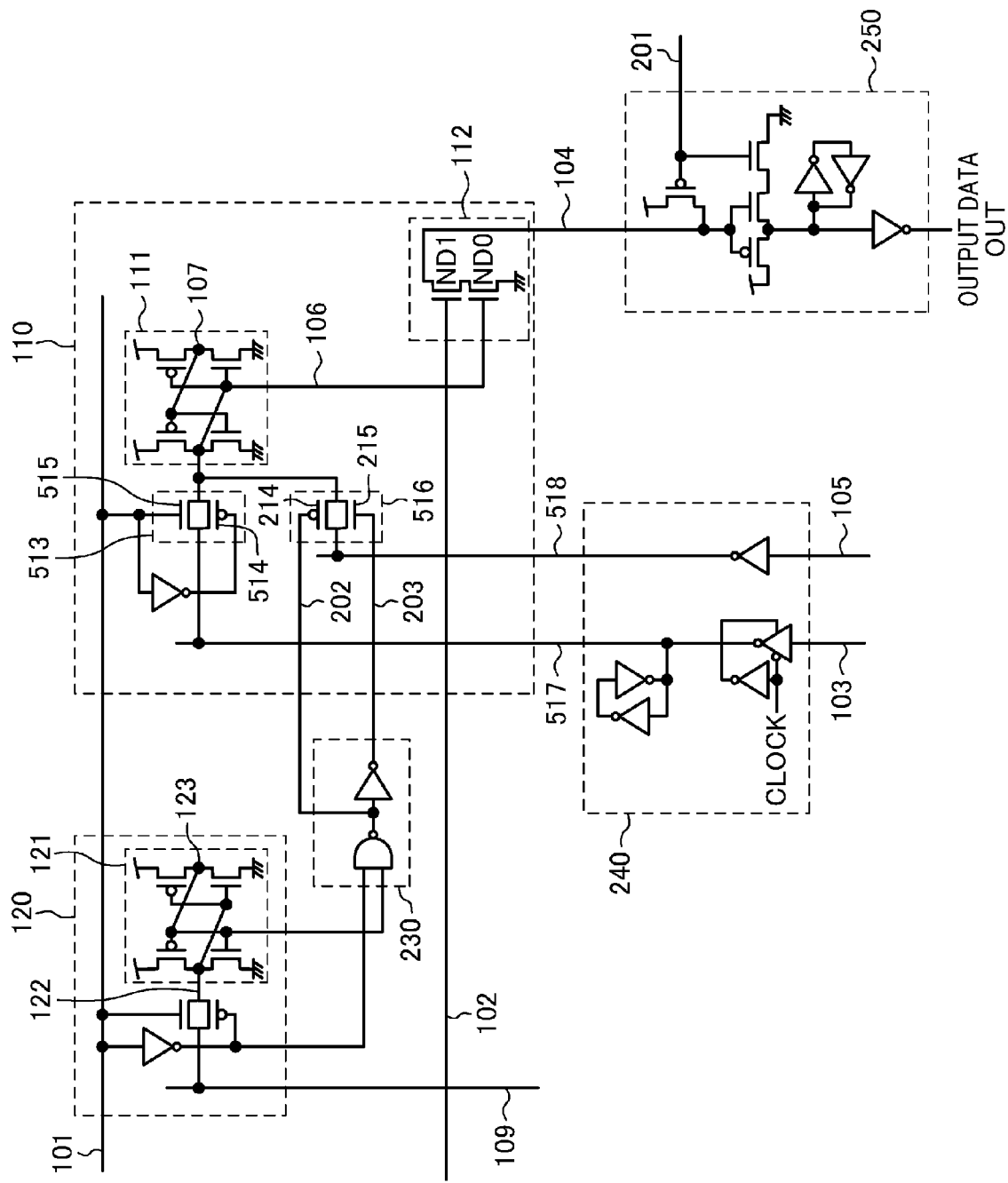
FIG. 7 is a circuit diagram of a semiconductor memory device of the fifth embodiment of the present disclosure.

FIG. 7 shows a circuit diagram of a semiconductor memory device of the fifth embodiment of the present disclosure. In the semiconductor memory device of FIG. 6 described above, the control signal for the second update circuit 516 is generated by the second memory node 123 of the memory circuit 121 of the page size cell 120 and the address translation enable signal TRANS. This increases the number of interconnects arranged in parallel with word lines. To avoid this problem, in FIG. 7, an inverted signal of the write word line 101 is used in place of the address translation enable signal TRANS.

As described above, according to the present disclosure, a high-yield, small-area, and high-speed semiconductor memory device can be implemented. Thus, the semiconductor memory device of the present disclosure is useful as a semiconductor memory device having an address translation function.

What is claimed is:

1. A semiconductor memory device comprising:
   a first memory circuit;
   a second memory circuit;
   a readout circuit configured to read out data stored in the first memory circuit to a first output data line based on the data in the first memory circuit and a first control signal;
   an update circuit configured to update the data in the first memory circuit to data on a first input data line using second input data from the second memory circuit; and
   an update data control circuit having a function of selectively outputting first update data or second update data to the first input data line.

2. The semiconductor memory device of claim 1, further comprising:
   an update control circuit configured to control the update circuit based on the data in the second memory circuit.

3. The semiconductor memory device of claim 2, wherein the update circuit for the first memory circuit has a PMOS transistor having a source coupled to the first input data line, a drain coupled to the first memory circuit, and a gate coupled to a first update control signal output from the update control circuit and an NMOS transistor having a source coupled to the first input data line, a drain coupled to the first memory circuit, and a gate coupled to a second update control signal output from the update control circuit, and
   the first update control signal is coupled to a first memory node of the second memory circuit via an inverter, and the second update control signal is coupled to a second memory node of the second memory circuit via an inverter.

4. The semiconductor memory device of claim 2, wherein the update circuit and the readout circuit are coupled to a same node of the first memory circuit.

5. The semiconductor memory device of claim 4, further comprising:

a power supply control circuit configured to control power supply of the first memory circuit based on the data in the second memory circuit.

6. The semiconductor memory device of claim 2, wherein a second control signal is input into the update control circuit.

7. The semiconductor memory device of claim 1, wherein the semiconductor memory device has a function of translating a virtual address into a physical address, and the first memory circuit is included in a physical address cell that stores a physical address, the second memory circuit is included in a page size cell that stores a page size, the first update data is a physical address, and the second update data is an effective address.

8. A semiconductor memory device comprising:
a first memory circuit;
a second memory circuit;
a readout circuit configured to read out data stored in the first memory circuit to a first output data line based on the data in the first memory circuit and a first control signal;

a first update circuit configured to update the data in the first memory circuit to first update data based on a second control signal; and a second update circuit configured to update the data in the first memory circuit to second update data based on data stored in the second memory circuit.

9. The semiconductor memory device of claim 8, further comprising:
an update control circuit configured to control the second update circuit based on the data in the second memory circuit.

10. The semiconductor memory device of claim 8, wherein the semiconductor memory device has a function of translating a virtual address into a physical address, and the first memory circuit is included in a physical address cell that stores a physical address, the second memory circuit is included in a page size cell that stores a page size, the first update data is a physical address, and the second update data is an effective address.

* * * * *